(12) United States Patent
Chuang et al.

(10) Patent No.: US 7,948,070 B2
(45) Date of Patent: May 24, 2011

(54) SEMICONDUCTOR PACKAGE HAVING IMPEDANCE MATCHING DEVICE

(75) Inventors: Tseng-ying Chuang, Kaohsiung (TW); Pao-nan Li, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 479 days.

(21) Appl. No.: 12/030,597

(22) Filed: Feb. 13, 2008

(65) Prior Publication Data

US 2008/0191362 A1    Aug. 14, 2008

(30) Foreign Application Priority Data

Feb. 14, 2007 (TW) ................................ 96105522 A

(51) Int. Cl.
*H01L 23/02* (2006.01)
(52) U.S. Cl. ........ 257/678; 257/723; 333/134; 333/126; 333/103; 333/262
(58) Field of Classification Search .......... 257/678–733, 257/6, 522, 275; 333/134, 126, 103, 262
See application file for complete search history.

(56) References Cited

U.S. PATENT DOCUMENTS

| | | | | |
|---|---|---|---|---|
| 3,721,919 A * | 3/1973 | Grace | ............................. | 331/96 |
| 3,868,594 A * | 2/1975 | Cornwell et al. | ............... | 331/99 |
| 4,329,779 A * | 5/1982 | England | .......................... | 29/840 |
| 5,279,988 A | 1/1994 | Saadat et al. | | |
| 5,361,403 A * | 11/1994 | Dent | ............................... | 455/74 |
| 5,423,074 A * | 6/1995 | Dent | ............................... | 455/74 |
| 5,652,557 A * | 7/1997 | Ishikawa | ...................... | 333/243 |
| 6,403,199 B2 * | 6/2002 | Mori et al. | .................... | 428/209 |
| 6,602,078 B2 | 8/2003 | Kwark | | |
| 6,750,736 B1 * | 6/2004 | Weller et al. | .................... | 333/26 |
| 6,825,734 B2 * | 11/2004 | Clark | ............................... | 331/96 |
| 7,249,337 B2 * | 7/2007 | Gisin et al. | ........................ | 716/15 |
| 7,598,824 B2 * | 10/2009 | Callewaert | ..................... | 333/134 |
| 2003/0189246 A1 * | 10/2003 | Iwaki et al. | ................... | 257/706 |

FOREIGN PATENT DOCUMENTS

| | | |
|---|---|---|
| JP | 11150371 A | 6/1999 |
| TW | 248330 B | 1/2006 |
| TW | 200605740 | 2/2006 |
| TW | 257271 B | 6/2006 |

* cited by examiner

*Primary Examiner* — Zandra Smith
*Assistant Examiner* — Telly D Green
(74) *Attorney, Agent, or Firm* — Tim Tingkang Xia; Morris, Manning & Martin, LLP

(57) ABSTRACT

A semiconductor package having an impedance matching device is disclosed, which is especially applicable to conventional system-in-package structures and system packaging design with high-density I/O design. The impedance matching device achieves impedance matching between a semiconductor chip and a signal transmission wiring on the substrate or between different systems integrated in the semiconductor package by employment of a vertical conductive line or combination of a vertical conductive line and a stub transmission line. The vertical conductive line is electrically connected with the signal transmission wiring on the substrate at one end thereof, and the stub transmission line may be further connected to the other end of the vertical conductive line. This impedance matching device helps to effectively reduce the wiring area of an impedance matching network of the semiconductor package and enhance the flexibility and interchangeability in layout of the wiring.

16 Claims, 3 Drawing Sheets

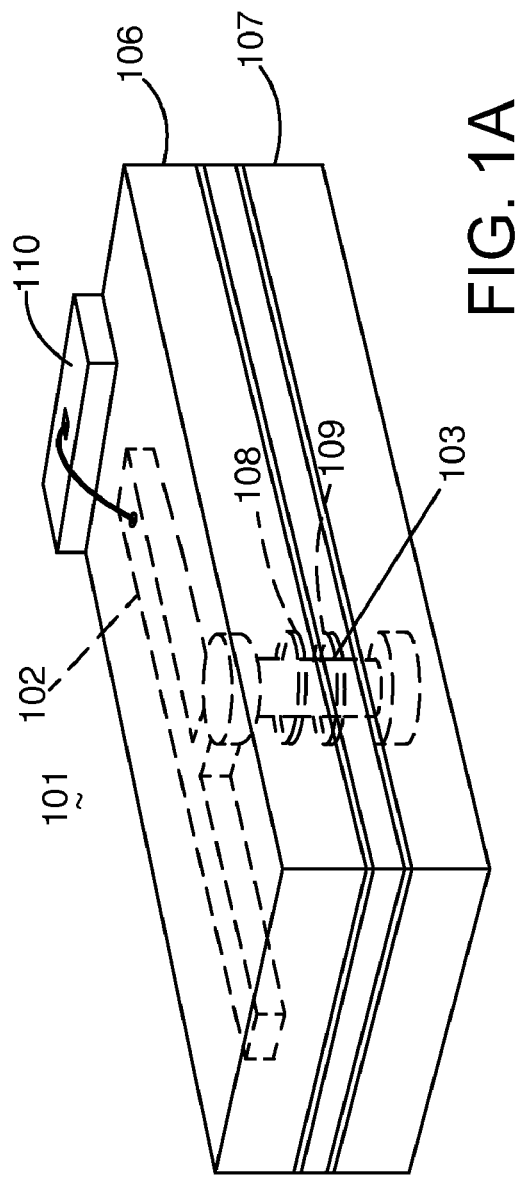
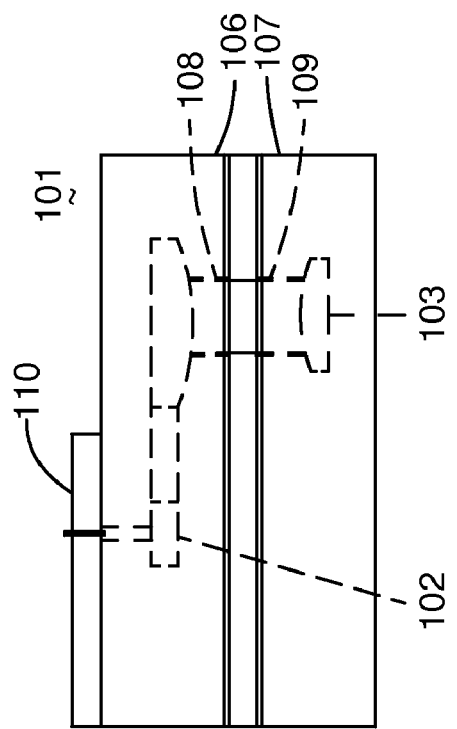
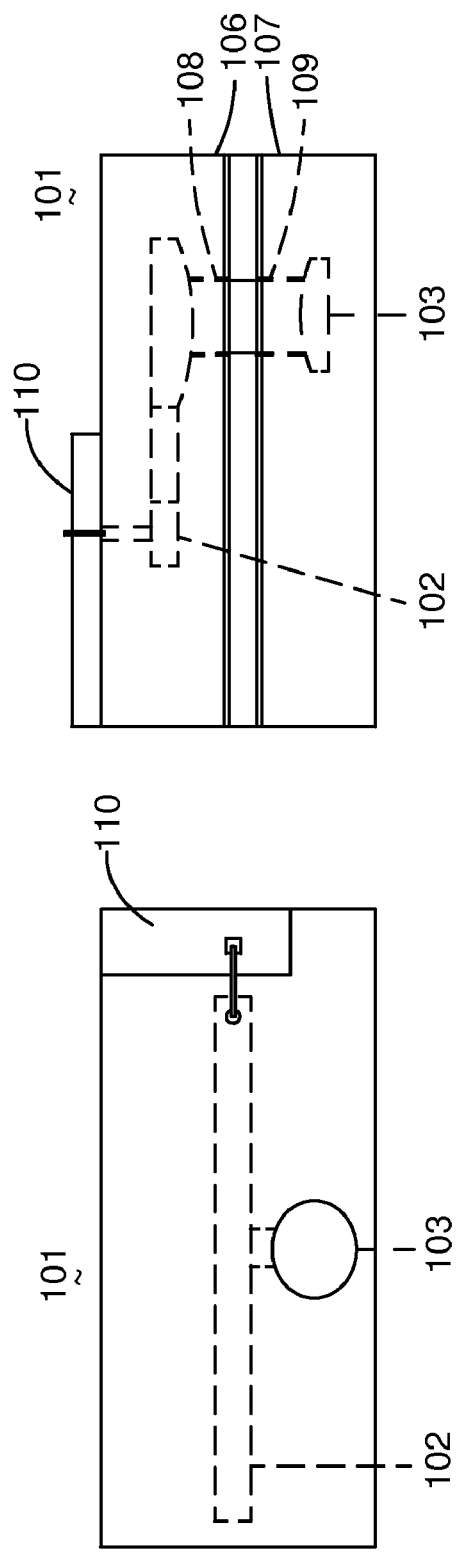

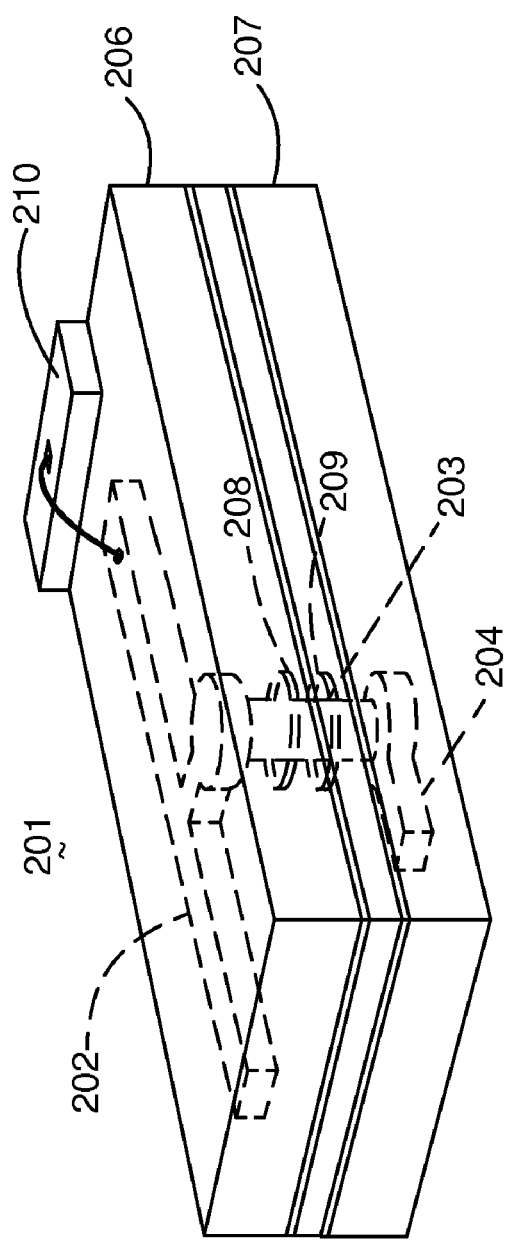
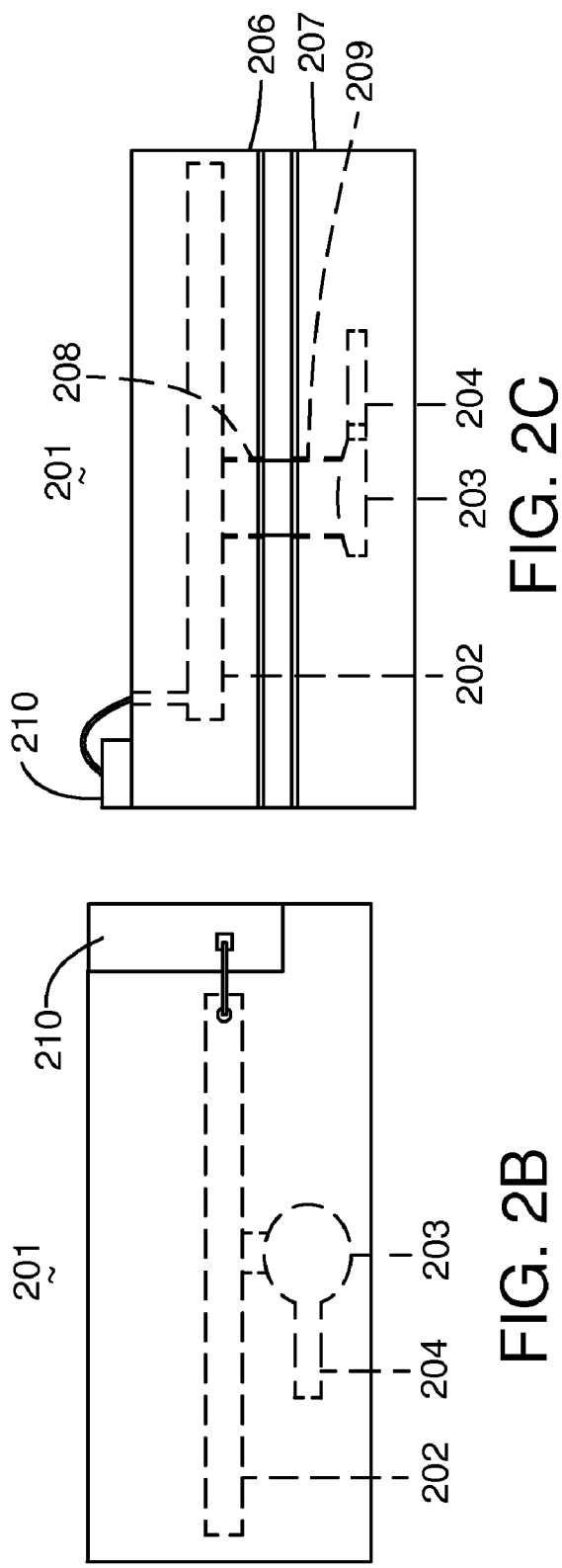

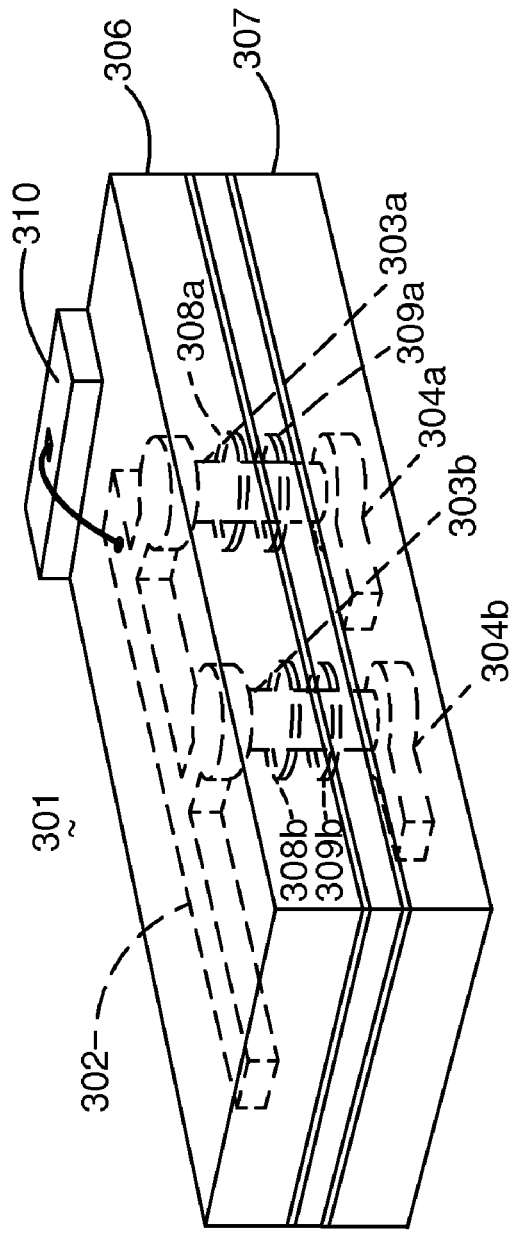
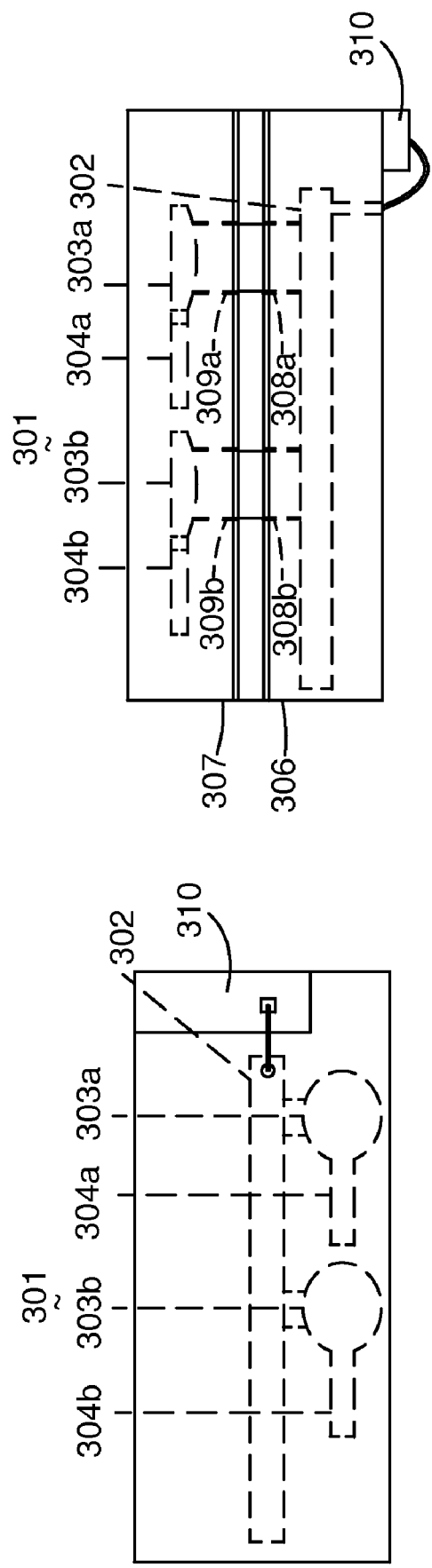

SEMICONDUCTOR PACKAGE HAVING IMPEDANCE MATCHING DEVICE

BACKGROUND OF THE INVENTION

1. Field of the Invention

The present invention relates to a semiconductor package, and particularly to a semiconductor package having an impedance matching device for achieving impedance matching between different systems integrated in the semiconductor package by means of a vertical conductive line or combination of a vertical conductive line and a stub transmission line.

2. Description of Prior Art

In the current electronic industry, electronic products, such as mobile phones, bluetooth systems, personal digital assistances and digital cameras, are increasingly required to be lightweight, thin, compact and multifunctional. Consequently, both electronic components and wiring in these electronic products have been increasing in number and reducing in size. This necessitates the introduction of system packaging technology so that subsystems, for example, microprocessors and memory units can be integrated in a semiconductor chip to obtain a compact size.

System-in-package (SiP) is now the fastest growing system-packaging technology since it is a cost-effective solution to high-density system integration in a single package. In a system-in-package structure, more than one semiconductor chips are stacked in three dimensions and passive components are integrated in the same package to reduce the size. When high quality electrical signals are required, decoupling capacitors are generally embedded in the package so as to provide low-loss electrical signal propagation. Therefore, by integration of embedded components at the substrate level, the system-in-package approach provides the advantage of significant area reduction on a printed circuit board. A system-in-package structure generally includes a multilayer substrate having metal wirings arranged thereon to provide high connection density, low cross-talk and good electromagnetic compatibility (EMC) capabilities, whereby the integrity of electrical signal can be maintained when the metal wirings are connected. As this integral electrical signal is able to meet the performance and reliability requirements for the package, maximum power transfer becomes the first consideration.

In the subsystems of a conventional system-in-package structure, besides resistors, reactive elements, such as capacitors and inductors, are also included. Therefore, to attain the maximum power transfer for ensuring the package performance and reliability, a conjugate match of all reactance of subsystems of the package as well as equal resistance of the subsystems is required. As reception and transmission of the electrical signals between various subsystems are accomplished by the metal wirings on the substrate, specific high frequency matching network is needed to reduce signal loss during signal reception and transmission. Generally, passive components, such as an inductor-capacitor (LC), are additionally added to the substrate to constitute such a matching network for impedance matching of the subsystems. However, this method results in increased cost and reduction of available space on the substrate. Further, the wiring area of the matching network is reduced, and flexibility and interchangeability in layout of the wiring is limited.

Hence, it is necessary to provide a semiconductor package having an impedance matching device that is able to achieve impedance matching between different systems integrated in the semiconductor package. The impedance matching device also helps to effectively reduce the wiring area of an impedance matching network of the semiconductor package and enhance the flexibility and interchangeability in layout of the wiring.

SUMMARY OF THE INVENTION

An object of the present invention is to provide a semiconductor package having an impedance matching device for achieving impedance matching between a semiconductor chip mounted on a substrate of the semiconductor package and a signal transmission wiring on the substrate or between different systems integrated in the semiconductor package. This impedance matching is accomplished by means of a vertical conductive line or combination of a vertical conductive line and a stub transmission line.

To achieve the above object, in one embodiment of the present invention, a semiconductor package includes a substrate having a metal wiring extending in a horizontal direction for transmitting an electrical signal, a semiconductor chip electrically connected with the substrate through the metal wiring, and a conductive line formed in the substrate in a direction substantially perpendicular to the metal wiring. The conductive line is electrically connected with the metal wiring to achieve impedance matching to the semiconductor chip.

A semiconductor package in accordance with another embodiment of the present invention includes a substrate having a metal wiring extending in a horizontal direction for transmitting an electrical signal, a plurality of semiconductor chips electrically connected with the substrate through the corresponding metal wiring, respectively, and at least one conductive line formed in the substrate in a direction substantially perpendicular to the metal wiring. The conductive line is electrically connected with the metal wiring to achieve impedance matching to the semiconductor chips.

The semiconductor package constructed according to the present invention comprises an impedance matching device to effectively achieve impedance matching between different systems integrated in the semiconductor package. The impedance matching device also helps to effectively reduce the wiring area of an impedance matching network of the semiconductor package and enhance the flexibility and interchangeability in layout of the wiring.

BRIEF DESCRIPTION OF THE DRAWINGS

The present invention may be best understood through the following description with reference to the accompanying drawings, in which:

FIGS. 1A to 1C are schematic representations of a semiconductor package having an impedance matching device according to a first embodiment of the present invention;

FIGS. 2A to 2C are schematic representations of a semiconductor package having an impedance matching device according to a first embodiment of the present invention; and FIGS. 3A to 3C are schematic representations of a semiconductor package having an impedance matching device according to a first embodiment of the present invention.

DETAILED DESCRIPTION OF THE PREFERRED EMBODIMENTS

Referring to FIGS. 1A to 1C, a substrate 101 of a semiconductor package having an impedance matching device according to a first embodiment of the present invention is schematically shown. The substrate 101, in an exemplary form of a system in package, has a multilayer substrate including a first substrate unit 106 and a second substrate unit 107 stacked over each other using conventional laminating technology. In the drawings of all embodiments of the present invention, the first and second substrate units 106 and 107 are shown, in an exaggerated manner, to be separated from each other for clear illustration purpose. The substrate 101 as shown is also only a portion of the whole semiconductor package in order to clearly show the impedance matching device thereof. The remaining portion of the whole semiconductor package is not shown for simplicity and clarity purposes for it forms no novel part of the present invention. Thus, a detailed description hereinafter is given to the impedance matching device of the present invention. As shown in FIGS. 1A to 1C, the substrate 101 has a metal wiring 102 provided in at least one insulation layer (unlabeled) of the first substrate unit 106 (or provided on a surface of at least one insulation layer of the first substrate unit 106), and above the second substrate unit 107. The metal wiring 102 extends in a horizontal direction for transmitting an electrical signal and electrically connects the first and second substrate units 106, 107 with a semiconductor chip 110 of the substrate 101. Except for the metal wiring 102, insulation layers of the first and second substrate units 106, 107 may be optionally provided with other metal wiring layers (not shown) thereon/therein for constituting a multilayer structure of the substrate 101. However, the multilayer structure of the substrate 101 as described above is traditional and not the feature of the present invention, so that related figure and detailed description thereof will be omitted hereinafter.

To match the impedance of the metal wiring 102 with that of the semiconductor chip 110, a vertical conductive line 103 is employed in accordance with the first embodiment. The impedance of the semiconductor chip 110 is first calculated, and the dimension of the vertical conductive line 103 is correspondingly adjusted to obtain an impedance matching that of the semiconductor chip 110. The vertical conductive line 103 is received in vertically aligned first and second vias 108 and 109 of the respective first and second substrate units 106 and 107. The vertical conductive line 103 is made of electrically conductive metal materials such as copper and gold. The vertical conductive line 103 is electrically connected in parallel with the metal wiring 102 at a predetermined position for impedance matching.

Referring to FIG. 1B, which is a top view of FIG. 1A, the vertical conductive line 103 is arranged in the substrate 101 in a manner that is substantially parallel to the metal wiring 102 when viewed from this angle.

Further referring to FIG. 1C, which is a side view of FIG. 1A, the vertical conductive line 103 is electrically connected with the metal wiring 102 at an upper end thereof for impedance matching, and extends from the first substrate unit 106 to the second substrate unit 107. Thus, when viewed from this angle, the vertical conductive line 103 is arranged in the substrate to be substantially perpendicular to the horizontal metal wiring 102.

Reference is now directed to FIGS. 2A to 2C, which schematically represent a substrate 201 having an impedance matching device according to a second embodiment of the present invention. In this embodiment, a vertical conductive line and a stub transmission line are employed for impedance matching. As shown in FIG. 2A, the substrate 201 has a substrate including a first substrate unit 206 and a second substrate unit 207, and a metal wiring 202 provided in at least one insulation layer (unlabeled) of the first substrate unit 206 (or provided on a surface of at least one insulation layer of the first substrate unit 206), and above the second substrate unit 207. The metal wiring 202 extends in a horizontal direction for transmitting an electrical signal and electrically connects the first and second substrate units 206, 207 with a semiconductor chip 210 of the substrate 201.

To match the impedance of the metal wiring 202 with that of the semiconductor chip 210, a vertical conductive line 203 and a horizontal stub transmission line 204 are employed in accordance with the second embodiment. The impedance of the semiconductor chip 210 is first calculated, and the dimension of the vertical conductive line 203 is correspondingly adjusted to obtain a desired impedance. In case that the desired impedance of the vertical conductive line 203 matching that of the semiconductor chip 210 can not be obtained by dimension adjustment, a stub transmission line 204 with a selected dimension can be further added to electrically connect in parallel with one end of the vertical conductive line 203. Thus, a combined impedance of the vertical conductive line 203 and the stub transmission line 204 matching that of the semiconductor chip 210 can be obtained to achieve the impedance matching purpose. The vertical conductive line 203 is received in vertically aligned first and second vias 208 and 209 of the respective first and second substrate units 206 and 207, and the stub transmission line 204 is provided in the second substrate unit 207 and extends in the horizontal direction. Both the vertical conductive line 203 and the stub transmission line 204 are made of electrically conductive metal materials such as copper and gold. The other end of the vertical conductive line 203, opposite to that connecting with the stub transmission line 204, is electrically connected in parallel with the metal wiring 202 at a predetermined position for impedance matching.

Referring to FIG. 2B, which is a top view of FIG. 2A, the combination of the vertical conductive line 203 and the stub transmission line 204 are arranged in the substrate 201 in a manner that it is substantially parallel to the metal wiring 202 when viewed from this angle.

Further referring to FIG. 2C, which is a side view of FIG. 2A, the vertical conductive line 203 is electrically connected in parallel with the metal wiring 202 and the stub transmission line 204 at respective opposite ends thereof, and extends from the first substrate unit 206 to the second substrate unit 207. Thus, when viewed from this angle, the vertical conductive line 203 is arranged in the first and second substrate units 206 and 207 to be substantially perpendicular to the metal wiring 202 and the stub transmission line 204, and the stub transmission line 204 is arranged in the second substrate unit 207 and substantially parallel to the metal wiring 202.

Reference is now directed to FIGS. 3A to 3C, which schematically represent a substrate 301 having an impedance matching device according to a third embodiment of the present invention. In this embodiment, a plurality of vertical conductive lines (two shown) and a plurality of stub transmission lines (two shown) are employed for impedance matching. As shown in FIG. 3A, the substrate 301 has a substrate including a first substrate unit 306 and a second substrate unit 307, and a metal wiring 302 provided in at least one insulation layer (unlabeled) of the first substrate unit 306 (or provided on a surface of at least one insulation layer of the first substrate unit 306), and above the second substrate unit 307. The metal wiring 302 extends in a horizontal direction for transmitting an electrical signal and electrically connects the first and second substrate units 306, 307 with a plurality of semiconductor chips 310 of the substrate 301, wherein only one of the semiconductor chips 310 is illustrated for simplifying FIGS. 3A to 3C.

To match the impedance of the metal wiring 302 with that of the semiconductor chips 310, first and second vertical conductive lines 303a, 303b and first and second stub transmission lines 304a, 304b are exemplarily employed in the third embodiment. The second vertical conductive line 303b and the second stub transmission line 304b are additionally adopted when the combined impedance of the first vertical conductive line 303a and the first stub transmission line 304a still can not match the impedance of the semiconductor chip 310. The first vertical conductive line 303a is received in vertically aligned vias 308a and 309a in the respective first and second substrate units 306 and 307, and similarly, the second vertical conductive line 303b is received in vertically aligned vias 308b and 309b in the respective first and second substrate units 306 and 307. The first and second stub transmission lines 304a, 304b are provided in the second substrate unit 307 and extend in the horizontal direction. The first and second vertical conductive lines 303a, 303b and the first and second stub transmission lines 304a, 304b are all made of electrically conductive metal materials such as copper and gold. One end of each first and second vertical conductive lines 303a, 303b is electrically connected in parallel with a corresponding first and second stub transmission line 304a, 304b, and the other end thereof is electrically connected in series with the metal wiring 302 at a predetermined position for impedance matching.

Referring to FIG. 3B, which is a top view of FIG. 3A, the combination of the first vertical conductive line 303a and the first stub transmission line 304a and the combination of the second vertical conductive line 303b and the second stub transmission line 304b are each arranged in the substrate 301 in a manner that they are substantially parallel to the metal wiring 302 when viewed from this angle.

Further referring to FIG. 3C, which is a side view of FIG. 3A, each first and second vertical conductive line 303a, 303b is electrically connected in parallel with the metal wiring 302 and a corresponding first and second stub transmission line 304a, 304b at respective opposite ends thereof, and extends from the first substrate unit 306 to the second substrate unit 307. Thus, when viewed from this angle, the first and second vertical conductive lines 303a, 303b are arranged in the first and second substrate units 306 and 307 to be substantially perpendicular to the metal wiring 302 and the first and second stub transmission lines 304a, 304b, and the first and second stub transmission lines 304a, 304b are arranged in the second substrate unit 307 to be substantially parallel to the metal wiring 302.

In comparison with the prior art, the semiconductor package constructed according to the present invention comprises an impedance matching device to effectively achieve impedance matching between a semiconductor chip and a signal transmission wiring or between different systems integrated in the semiconductor package in a simple manner. Impedance matching is accomplished by means of a vertical conductive line or combination of a vertical conductive line and a stub transmission line that is disposed in the substrate. The impedance matching device as constructed helps to effectively reduce the wiring area of an impedance matching network of the semiconductor package and enhance the flexibility and interchangeability in layout of the wiring.

It should be understood that, although in the above embodiments, the vertical conductive line is disclosed to be electrically connected with the metal wiring and the stub transmission line in parallel, the present invention is not so limited. A series electrical connection therebetween is also practicable so long as the impedance matching purpose can be achieved.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:
1. A semiconductor package, comprising:
   a substrate having a metal wiring extending in a horizontal direction for transmitting an electrical signal, wherein the substrate is electrically connected with a semiconductor chip through the metal wiring;
   a conductive line disposed in the substrate in a direction substantially perpendicular to the metal wiring, the conductive line being electrically connected with the metal wiring to achieve impedance matching to the semiconductor chip; and
   a stub transmission line disposed in the substrate for impedance matching to the semiconductor chip, the stub transmission line having a first end being electrically and perpendicularly connected with the conductive line in the substrate and a second end being in the substrate and electrically disconnecting to any circuit or device.

2. The semiconductor package as claimed in claim 1, wherein the conductive line is made of an electrically conductive metal.

3. The semiconductor package as claimed in claim 1, wherein the substrate defines a via, in which the conductive line is received.

4. The semiconductor package as claimed in claim 1, wherein the substrate includes first and second substrate units, and the conductive line extends from the first substrate unit to the second substrate unit.

5. The semiconductor package as claimed in claim 1, wherein the conductive line is electrically connected in parallel with the metal wiring.

6. The semiconductor package as claimed in claim 1, wherein the stub transmission line is arranged to be substantially parallel to the metal wiring.

7. The semiconductor package as claimed in claim 1, wherein the stub transmission line is made of an electrically conductive metal.

8. The semiconductor package as claimed in claim 1, wherein the substrate includes first and second substrate units, the conductive line extending from the first substrate unit to the second substrate unit, the stub transmission line being disposed in the second substrate unit.

9. A semiconductor package, comprising:
   a substrate having a metal wiring extending in a horizontal direction for transmitting an electrical signal, wherein the substrate is electrically connected with a plurality of semiconductor chips through the corresponding metal wiring, respectively;
   at least one conductive line disposed in the substrate in a direction substantially perpendicular to the metal wiring, the at least one conductive line being electrically connected with the metal wiring to achieve impedance matching to the semiconductor chips; and
   a stub transmission line disposed in the substrate for impedance matching to the semiconductor chips, the stub transmission line having a first end being electrically and perpendicularly connected with the at least one conductive line in the substrate and a second end being in the substrate and electrically disconnecting to any circuit or device.

10. The semiconductor package as claimed in claim 9, wherein the at least one conductive line is made of an electrically conductive metal.

11. The semiconductor package as claimed in claim 9, wherein the substrate defines at least one via, in which the at least one conductive line is received.

12. The semiconductor package as claimed in claim 9, wherein the substrate includes first and second substrate units, and the at least one conductive line extends from the first substrate unit to the second substrate unit.

13. The semiconductor package as claimed in claim 9, wherein the at least one conductive line is electrically connected in parallel with the metal wiring.

14. The semiconductor package as claimed in claim 9, wherein the stub transmission line is arranged to be substantially parallel to the metal wiring.

15. The semiconductor package as claimed in claim 9, wherein the stub transmission line is made of an electrically conductive metal.

16. The semiconductor package as claimed in claim 9, wherein the substrate includes first and second substrate units, the at least one conductive line extending from the first substrate unit to the second substrate unit, the stub transmission line being disposed in the second substrate unit.

* * * * *